(12) United States Patent
Huang

(10) Patent No.: US 7,375,581 B2
(45) Date of Patent: May 20, 2008

(54) VOLTAGE GENERATING CIRCUIT

(75) Inventor: Yong-Zhao Huang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/309,402

(22) Filed: Aug. 4, 2006

(65) Prior Publication Data

US 2007/0075749 A1   Apr. 5, 2007

(30) Foreign Application Priority Data

Aug. 12, 2005   (CN)   .................. 2005 1 0036595

(51) Int. Cl.
*G05F 1/10* (2006.01)

(52) U.S. Cl. ...................................... 327/538

(58) Field of Classification Search ................. 327/530
See application file for complete search history.

(56) References Cited

U.S. PATENT DOCUMENTS 6,281,745 B1    8/2001   Kim et al.
7,218,082 B2 *  5/2007   Walter et al. ............... 323/273

* cited by examiner

*Primary Examiner*—Charles D. Garber
*Assistant Examiner*—Daniel Rojas
(74) *Attorney, Agent, or Firm*—Wei Te Chung

(57) ABSTRACT

A voltage generating circuit for providing a voltage signal to a memory in a computer is provided. The voltage generating circuit includes a voltage selecting circuit and a control circuit. The control circuit, responsive to a first and a second voltage control signal, controls the voltage selecting circuit to gate a first voltage input or a second voltage input into a terminal of a regulating transistor. Another terminal of the regulating transistor outputs the voltage signal to the memory.

14 Claims, 2 Drawing Sheets

VOLTAGE GENERATING CIRCUIT

FIELD OF THE INVENTION

The present invention relates to a voltage generating circuit, and more particularly to a voltage generating circuit for a memory in a computer.

DESCRIPTION OF RELATED ART

In general, a user can make a computer enter various sleeping states through a user setting in Advanced Configuration and Power Interface (ACPI), in order to protect the computer and save energy.

Typically, an ACPI has various states as follows: S0, S1, S2, S3, S4, and S5. While a system is in the S0 state, it is in the system working state. That is, all devices, such as processors, dynamic random access memory (DRAM), power resources terminals and etc., are all maintained. The S0 state is further divided into two sub-states, a before Advanced Technology Extend Power OK (ATXPOK) S0 state and an after ATXPOK S0 state. The conversion of the before and after ATXPOK S0 states is instantaneous. While the system is in the S1 sleeping state, which is also called Power on Suspend (POS), processors of the system are not executing instructions. However, the processor-complex context is maintained. The S2 sleeping state is logically lower than the S1 state. And it is assumed to conserve more power. In the S2 sleeping state, the processors are not executing instructions. Meanwhile, the processor-complex context is not maintained. The S3 state, which is familiar to us, is also called Suspend to RAM (STR). It is logically lower than the S2 state. And it is assumed to conserve more power. In the S3 state, all the devices except DRAM are not maintained. Contents of the DRAM can be maintained by hardware. The S3 state is a commonly used power saving state. Then there is the S4 state, which is also called Suspend to Disk (STD), it is logically lower than the S3 state and is assumed to conserve more power. In the S4 state, a system main power is turned off. A copy of memory is saved to a disk. All the devices stop working while the disk has a power supply. The disk is wakened when needed. The S5 state is in the soft off state and requires a complete boot when awakened. In the S5 state, all the devices including the power supply is turned off.

A function of the commonly used STR state is to save execution data of the system to a memory. In the STR state, a power supply is needed for main devices such as the memory to insure no loss of important data. However, other devices are turned off to save energy. The system is awakened when a power button is pressed, and a previous working state before STR is resumed by the memory.

Referring to FIG. 2, a typical voltage generating circuit for providing the computer memory with voltage in various ACPI states includes a voltage selecting circuit 1 and control circuits 3, 5. The control circuits 3, 5 respond to a control signal SLP_S4, and a control signal ATXPOK respectively, for controlling the voltage selecting circuit 1 to output a voltage signal 2.6V_STR to the computer memory. However, there are so many components in the typical voltage generating circuit that connections between them are complex. Thus, cost of the typical voltage generating circuit for the computer memory is high.

What is needed, therefore, is a less complex and less expensive voltage generating circuit for providing the memory with voltage in various ACPI states.

SUMMARY OF THE INVENTION

A voltage generating circuit for providing a voltage signal to a memory in a computer is provided. In a preferred embodiment, the voltage generating circuit comprises a voltage selecting circuit and a control circuit. The voltage selecting circuit includes a first metal-oxide-semiconductor field-effect transistor (MOSFET) having a first terminal connected to a first voltage input, a second terminal, and a control terminal; a second MOSFET having a first terminal, a second terminal connected to the second terminal of the first MOSFET, and a control terminal for receiving a first high level signal; and a diode having an anode connected to a second voltage input, and a cathode connected to the second terminal of the second MOSFET. The control circuit includes a bipolar junction transistor (BJT), the BJT having a control terminal for receiving a first voltage control signal, a first terminal connected to ground and receiving a second voltage control signal, and a second terminal connected to the control terminal of the first MOSFET and receiving a second high level signal, the control circuit responsive to the first and second voltage control signals controlling the voltage selecting circuit to gate the first voltage input or the second voltage input into the second terminal of the second MOSFET, and the first terminal of second MOSFET outputting the voltage signal to the computer memory.

Other advantages and novel features will become more apparent from the following detailed description when taken in conjunction with the accompanying drawings, in which:

DETAILED DESCRIPTION OF THE INVENTION

Figure 1:
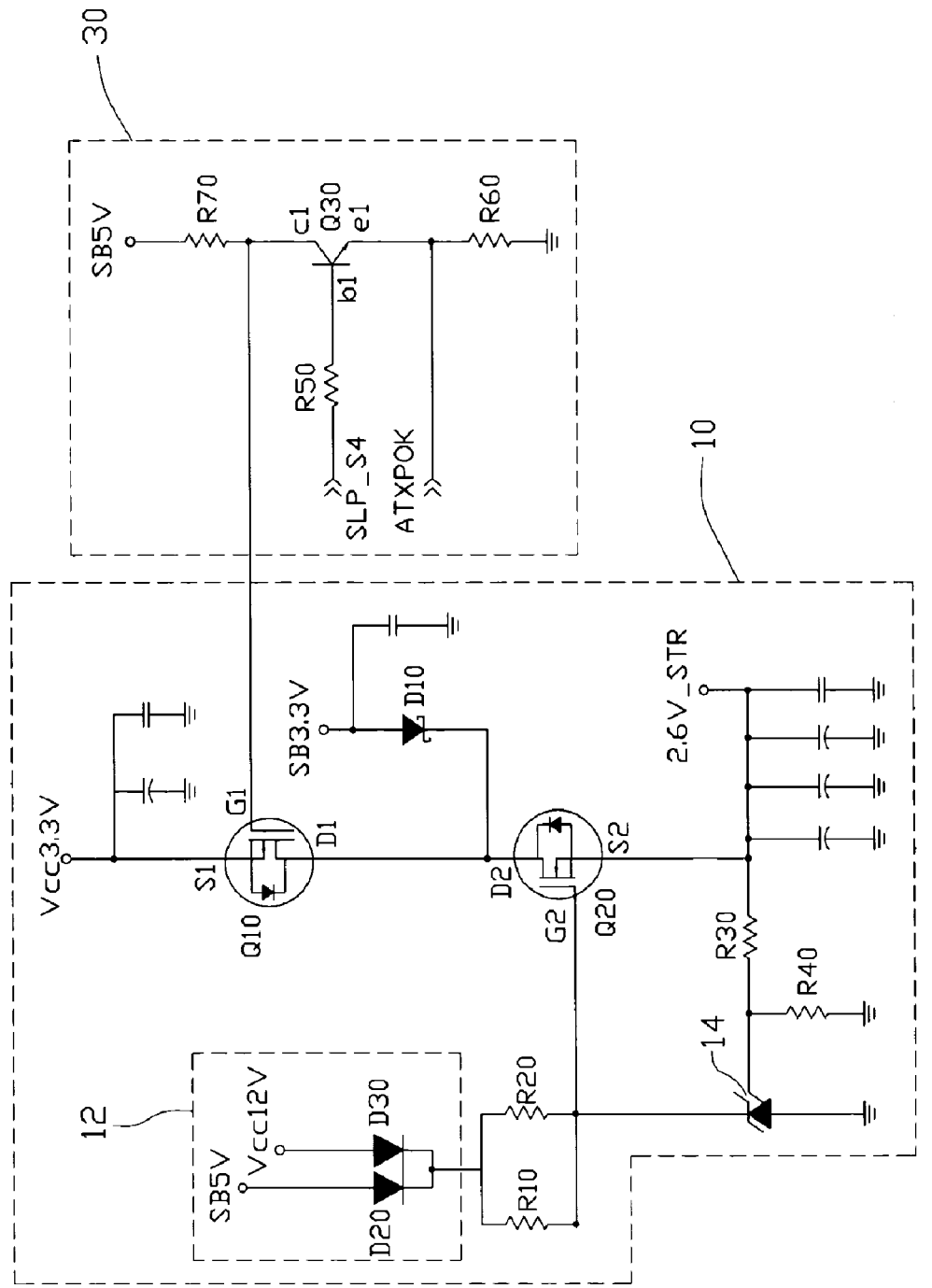
FIG. 1 is a circuit diagram of a voltage generating circuit, in accordance with a preferred embodiment of the present invention.
Figure 2:
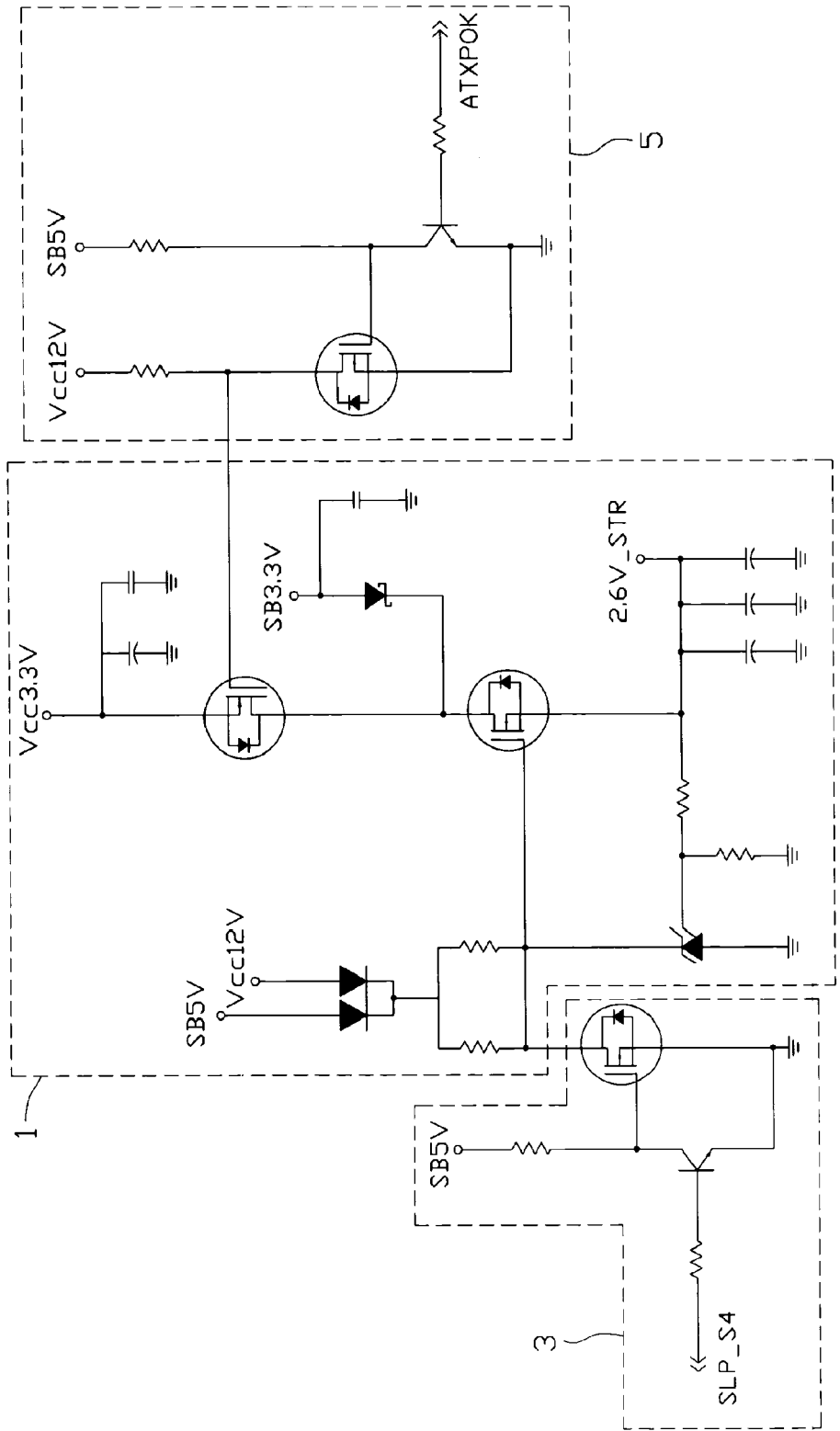
FIG. 2 is a circuit diagram of a typical voltage generating circuit.

Referring to FIG. 1, a voltage generating circuit for providing a voltage signal to a computer memory in accordance with a preferred embodiment of the present invention includes a voltage selecting circuit 10 and a control circuit 30.

The voltage selecting circuit 10 includes a first metal-oxide-semiconductor field-effect transistor (MOSFET) Q10 (or, alternatively, another suitable electrical switch), a second MOSFET Q20 (or, alternatively, another suitable regulating transistor), a diode D10 (or, alternatively, another suitable unidirectional passing element), an 'or' gate circuit 12, and a voltage regulator 14. The first MOSFET Q10 has a first terminal S1 connected to a first voltage input Vcc3.3V, a second terminal D1, and a control terminal G1. The second MOSFET Q20 has a control terminal G2, a first terminal S2, and a second terminal D2 connected to the second terminal D1 of the first MOSFET Q10. The diode D10 has an anode connected to a second voltage input SB3.3V, and a cathode connected to the second terminal D2 of the second MOSFET Q20. The 'or' gate circuit 12 includes diodes D20, D30. Anodes of the diodes D20, D30, serving as inputs of the 'or' gate circuit 12, are respectively connected to a third voltage input SB5V and a fourth voltage input Vcc12V. Cathodes of the diodes D20, D30, which are connected together to serve as an output of the 'or' gate circuit 12, provide a first high level signal for the control terminal G2 of the second MOSFET Q20 via two resistors R10, R20 connected in parallel. The voltage regulator 14 has a cathode receiving the first high level signal, an anode connected to ground, and an output terminal connected to the first terminal S2 of the second MOSFET Q20 via a resistor R30, for stabilizing a voltage output of the first terminal S2 of the second MOSFET Q20. A node between the resistor R30 and the output terminal of the voltage regulator 14 is connected to ground via a resistor R40. The first voltage input Vcc3.3V and the fourth voltage input Vcc12V are provided only at S0 (after ATXPOK), S1, and S2 states. The second voltage input SB3.3V and the third voltage input SB5V are provided at any one of states S0, S1, S2, S3, S4, and S5.

The control circuit 30 includes a bipolar junction transistor (BJT) Q30 (or other suitable electrical switch). The BJT Q30 has a control terminal b1 for receiving a first voltage control signal SLP_S4 via a resistor R50, a first terminal e1 connected to ground via a resistor R60 and receiving a second voltage control signal ATXPOK, and a second terminal c1 connected to the control terminal G1 of the first MOSFET Q10 and receiving a second high level signal. The third voltage input SB5V provides the second high level signal for the BJT via a resistor R70. The first voltage control signal SLP_S4 comes from a south bridge, and the second voltage control signal ATXPOK comes from a motherboard voltage supply.

The control circuit 30, responsive to the first voltage control signal SLP_S4 and the second voltage control signal ATXPOK, controls the voltage selecting circuit 10 to gate the first voltage input Vcc3.3V or the second voltage input SB3.3V into the second terminal D2 of the second MOSFET Q20, and the first terminal S2 of the second MOSFET Q20 outputs the voltage signal 2.6V_STR to the computer memory. The following table shows signal states and transistor states corresponding to ACPI states:

| ACPI states | SLP_S4 | ATXPOK | c1 | Q10 | Q20 | Power from |
|---|---|---|---|---|---|---|
| S5 | low | low | high | on | on | Nothing |
| S4 | low | low | high | on | on | Nothing |
| S0(before ATXPOK) | high | low | low | off | on | SB3.3 V |
| S0(after ATXPOK) | high | high | high | on | on | Vcc3.3 V |
| S1 | high | high | high | on | on | Vcc3.3 V |
| S2 | high | high | high | on | on | Vcc3.3 V |
| S3 | high | low | low | off | on | SB3.3 V |

At S5 and S4 states, the first voltage control signal SLP_S4 and the second voltage control signal ATXPOK are at low level. Then the second terminal c1 of the BJT Q30 is at high level. The MOSFETs Q10, Q20 turn on. The diode D10 turns off. The first voltage input Vcc3.3V is not provided. The second terminal D2 is blocked to receive the second voltage input SB3.3V since the diode D10 turns off. Therefore no voltage signal is provided at the second terminal D2 of the second MOSFET Q20 and no voltage signal is output from the first terminal S2 of the second MOSFET Q20 to the computer memory. At S0 (after ATXPOK), S1, and S2 states, the first voltage control signal SLP_S4 and the second voltage control signal ATXPOK are at high level. Then the second terminal c1 of the BJT Q30 is at high level. The MOSFETs Q10, Q20 turn on. The diode D10 turns off. The first voltage input Vcc3.3V is provided. Therefore the second terminal D2 of the second MOSFET Q20 is provided with the first voltage input Vcc3.3V, and the first terminal S2 of second MOSFET Q20 outputs the voltage signal 2.6V_STR to the computer memory. While at S3 and S0 (before ATXPOK) states, the first voltage control signal SLP_S4 is at high level and the second voltage control signal ATXPOK is at low level. Then the second terminal c1 of the BJT Q30 is at low level. The MOSFET Q10 turns off and the Q20 turns on. The diode D10 turns on. The first voltage input Vcc3.3V is not provided and the second voltage input SB3.3V is provided, the voltage selecting circuit 10 thereby provides the second voltage input SB3.3V for the second terminal D2 of the second MOSFET Q20, and the first terminal S2 of second MOSFET Q20 outputs the voltage signal 2.6V_STR to the computer memory.

It is believed that the present invention and its advantages will be understood from the foregoing description, and it will be apparent that various changes may be made thereto without departing from the spirit and scope of the invention or sacrificing all of its material advantages, the example hereinbefore described merely being preferred or exemplary embodiments.

What is claimed is:

1. A voltage generating circuit for providing a voltage signal to a memory in a computer, the voltage generating circuit comprising:
   a voltage selecting circuit comprising:
      a first metal-oxide-semiconductor field-effect transistor (MOSFET) having a first terminal connected to a first voltage input, a second terminal, and a control terminal;
      a second MOSFET having a first terminal, a second terminal connected to the second terminal of the first MOSFET, and a control terminal receiving exclusively a first high level signal; and
      a diode having an anode connected to a second voltage input, and a cathode connected to the second terminal of the second MOSFET; and
   a control circuit comprising a bipolar junction transistor (BJT), the BJT having a control terminal for receiving a first voltage control signal, a first terminal connected to ground and receiving a second voltage control signal, and a second terminal connected to the control terminal of the first MOSFET and receiving a second high level signal, the control circuit responsive to the first and second voltage control signals controlling the voltage selecting circuit to gate the first voltage input or the second voltage input into the second terminal of the second MOSFET, and the first terminal of second MOSFET outputting the voltage signal to the memory.

2. The voltage generating circuit as claimed in claim 1, wherein the first voltage control signal comes from a south bridge in the computer, and the second voltage control signal comes from a motherboard voltage supply in the computer.

3. The voltage generating circuit as claimed in claim 1, wherein the voltage selecting circuit further comprises an 'or' gate circuit, the 'or' gate circuit has two inputs respectively connected to a third voltage input and a fourth voltage input, and an output providing the first high level signal via two resistors connected in parallel.

4. The voltage generating circuit as claimed in claim 3, wherein the voltage selecting circuit further comprises a voltage regulator, the voltage regulator has a cathode receiving the first high level signal, an anode connected to ground, and an output terminal connected to the first terminal of the second MOSFET.

5. The voltage generating circuit as claimed in claim 1, wherein the first voltage control signal is input to the BJT via a resistor.

6. The voltage generating circuit as claimed in claim 3, wherein the third voltage input provides the second high level signal for the BJT via a resistor.

7. A voltage generating circuit for providing a voltage signal to a computer or server memory, the voltage generating circuit comprising:
   a first electrical switch having a first terminal connected to a first voltage input, a second terminal, and a control terminal;
   a regulating transistor having a first terminal, a second terminal connected to the second terminal of the first electrical switch, and a control terminal for receiving a first high level signal;
   a unidirectional passing element connected between a second voltage input and the second terminal of the regulating transistor; and
   a second electrical switch having a control terminal for receiving a first voltage control signal coming from a south bridge, a first terminal connected to ground and receiving a second voltage control signal coming from a motherboard voltage supply, and a second terminal connected to the control terminal of the first electrical switch and receiving a second high level signal, the second electrical switch responsive to the first and second voltage control signals for controlling the first electrical switch to turn on or off, whereby the second terminal of the regulating transistor selectively receiving the first voltage input or the second voltage input to allow the first terminal of the regulating transistor outputting the voltage signal to the memory.

8. The voltage generating circuit as claimed in claim 7, further comprising an 'or' gate circuit, the 'or' gate circuit has two inputs respectively connected to a third voltage input and a fourth voltage input, and an output providing the first high level signal via two resistors connected in parallel.

9. The voltage generating circuit as claimed in claim 8, further comprising a voltage regulator, the voltage regulator has a cathode receiving the first high level signal, an anode connected to ground, and an output terminal connected to the first terminal of the regulating transistor.

10. The voltage generating circuit as claimed in claim 7, wherein the first voltage control signal is input to the second electrical switch via a resistor.

11. The voltage generating circuit as claimed in claim 8, wherein the third voltage input provides the second high level signal for the second electrical switch via a resistor.

12. A voltage generating circuit for providing a voltage signal to a memory of an electrical apparatus, the voltage generating circuit comprising;
   a first electrical switch having a first terminal connected to a first voltage input, a second terminal, and a control terminal;
   a regulating transistor having a first terminal, a second terminal connected to the second terminal of the first electrical switch, and a control terminal configured for receiving a first high level signal;
   a unidirectional passing element connected between a second voltage input and the second terminal of the regulating transistor; and
   a second electrical switch connected between a third voltage input and ground, the second electrical switch having a control terminal configured for receiving a voltage control signal, the third voltage input connected to the control terminal of the first electrical switch, the second electrical switch being responsive to the voltage control signal for controlling the first electrical switch to turn on or off, whereby the second terminal of the regulating transistor selectively receiving one of the first voltage input and the second voltage input to allow the first terminal of the regulating transistor outputting the voltage signal to the memory, wherein the voltage control signal comes from a south bridge in the electrical apparatus, and the second electrical switch further comprises a first terminal to be configured for receiving an additional voltage control signal coming from a motherboard voltage supply in the electrical apparatus.

13. The voltage generating circuit as claimed in claim 12, wherein the second electrical switch is a bipolar junction transistor, and the bipolar junction transistor further comprises the first terminal thereof connected with ground, and a second terminal connected to the control terminal of the first electrical switch.

14. The voltage generating circuit as claimed in claim 13, wherein the third voltage input is connected to a node between the control terminal of the first electrical switch and the second terminal of the second electrical switch via a resistor.

* * * * *